US 12,209,734 B2

(12) United States Patent
Huang et al.

(10) Patent No.: US 12,209,734 B2
(45) Date of Patent: Jan. 28, 2025

(54) LIGHT EMITTING PANEL

(71) Applicant: AUO Corporation, Hsin-Chu (TW)

(72) Inventors: Yu-Hsin Huang, Hsin-Chu (TW);
Kuan-Heng Lin, Hsin-Chu (TW);
Yi-Hong Chen, Hsin-Chu (TW);
Chia-An Lee, Hsin-Chu (TW);
Seok-Lyul Lee, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 224 days.

(21) Appl. No.: 17/869,814

(22) Filed: Jul. 21, 2022

(65) Prior Publication Data

US 2023/0094050 A1    Mar. 30, 2023

(30) Foreign Application Priority Data

Sep. 28, 2021 (TW) .................................. 110136084

(51) Int. Cl.
*F21V 19/00* (2006.01)
*F21Y 105/00* (2016.01)

(52) U.S. Cl.
CPC ....... *F21V 19/0015* (2013.01); *F21Y 2105/00* (2013.01)

(58) Field of Classification Search
CPC . F21V 19/0015; F21Y 2105/00; G09G 3/207; G09G 3/32; G09G 2300/0426; G09G 2300/0452; G09G 2300/0439; H01L 33/62; H01L 25/0753
USPC .................................................. 345/1.3, 613
See application file for complete search history.

(56) References Cited

U.S. PATENT DOCUMENTS

| 2009/0322649 | A1* | 12/2009 | Hamer | G09G 3/2085 345/1.3 |
| 2016/0019019 | A1* | 1/2016 | Ikeda | G06F 3/0412 345/1.3 |
| 2017/0123268 | A1* | 5/2017 | Sasaki | H01L 27/15 |
| 2018/0323180 | A1* | 11/2018 | Cok | H01L 23/5386 |
| 2019/0139416 | A1* | 5/2019 | Kendall | B60R 1/06 |
| 2019/0371213 | A1 | 12/2019 | Liu | |
| 2021/0013275 | A1* | 1/2021 | Kim | H10K 50/82 |
| 2021/0280632 | A1* | 9/2021 | Kim | H01L 33/005 |
| 2021/0358388 | A1 | 11/2021 | Zhang | |
| 2021/0376196 | A1* | 12/2021 | Lee | H01L 33/62 |

(Continued)

FOREIGN PATENT DOCUMENTS

CN    112489570 A    3/2021

*Primary Examiner* — Prabodh M Dharia
(74) *Attorney, Agent, or Firm* — WPAT, P.C

(57) ABSTRACT

A light emitting panel includes a circuit substrate, a plurality of first light emitting components, a plurality of second light emitting components, and a plurality of third light emitting components. The circuit substrate has a plurality of main pixel areas. Each main pixel area is divided into a first subpixel area, a second subpixel area, and a third subpixel area. The first light emitting components, the second light emitting components and the third light emitting components are located in the first subpixel areas, the second subpixel areas and the third subpixel areas respectively. The first light emitting components in two adjacent first subpixel areas are electrically connected in series. The size of each of the first light emitting components is larger than the size of each of the second light emitting components and the third light emitting components.

20 Claims, 10 Drawing Sheets

(56) References Cited

U.S. PATENT DOCUMENTS

2021/0408349 A1\* 12/2021 Cai ........................ H01L 33/46
2022/0005389 A1    1/2022 Liu
2022/0077245 A1\*  3/2022 Lee ...................... H10K 59/121

\* cited by examiner

LIGHT EMITTING PANEL

CROSS-REFERENCE TO RELATED APPLICATION

This application claims priority to Taiwan Application Serial Number 110136084, filed Sep. 28, 2021, which is herein incorporated by reference in its entirety.

BACKGROUND

Technical Field

The present disclosure relates to an electroluminescent device. More particularly, the present disclosure relates to a light emitting panel.

Description of Related Art

Nowadays, light emitting diodes (LEDs) have been used in displays, and in a display with a plurality of LEDs, the luminous efficiency of the LEDs, such as current efficiency, has a significant impact on the quality of images. Hence, many manufacturers study to improve the luminous efficiency (e.g., current efficiency) of subpixels in a display, so as to enhance the quality of images of the display.

SUMMARY

At least one embodiment of the disclosure provides a light emitting panel which employs a series electrical connection of light emitting components to improve the luminous efficiency.

A light emitting panel according to at least one embodiment of the disclosure includes a circuit substrate, a plurality of first light emitting components, a plurality of second light emitting components and a plurality of third light emitting components. The circuit substrate has a plurality of main pixel areas. Each of the main pixel areas is divided into a first subpixel area, a second subpixel area and a third subpixel area, in which the first subpixel areas in adjacent two main pixel areas are adjacent to each other. The first light emitting components are disposed on the circuit substrate and located in the first subpixel areas respectively, where the first light emitting components in two first subpixel areas adjacent to each other are electrically connected in series. The second light emitting components are disposed on the circuit substrate and located in the second subpixel areas respectively. The third light emitting components are disposed on the circuit substrate and located in the third subpixel areas respectively, in which the size of each of the first light emitting components is larger than the size of each of the second light emitting components and also larger than the size of each of the third light emitting components.

Based on the above, the luminous efficiency of the light emitting panel can be improved by the light emitting components which are adjacent to each other and electrically connected in series, thereby enhancing the quality of images of display.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
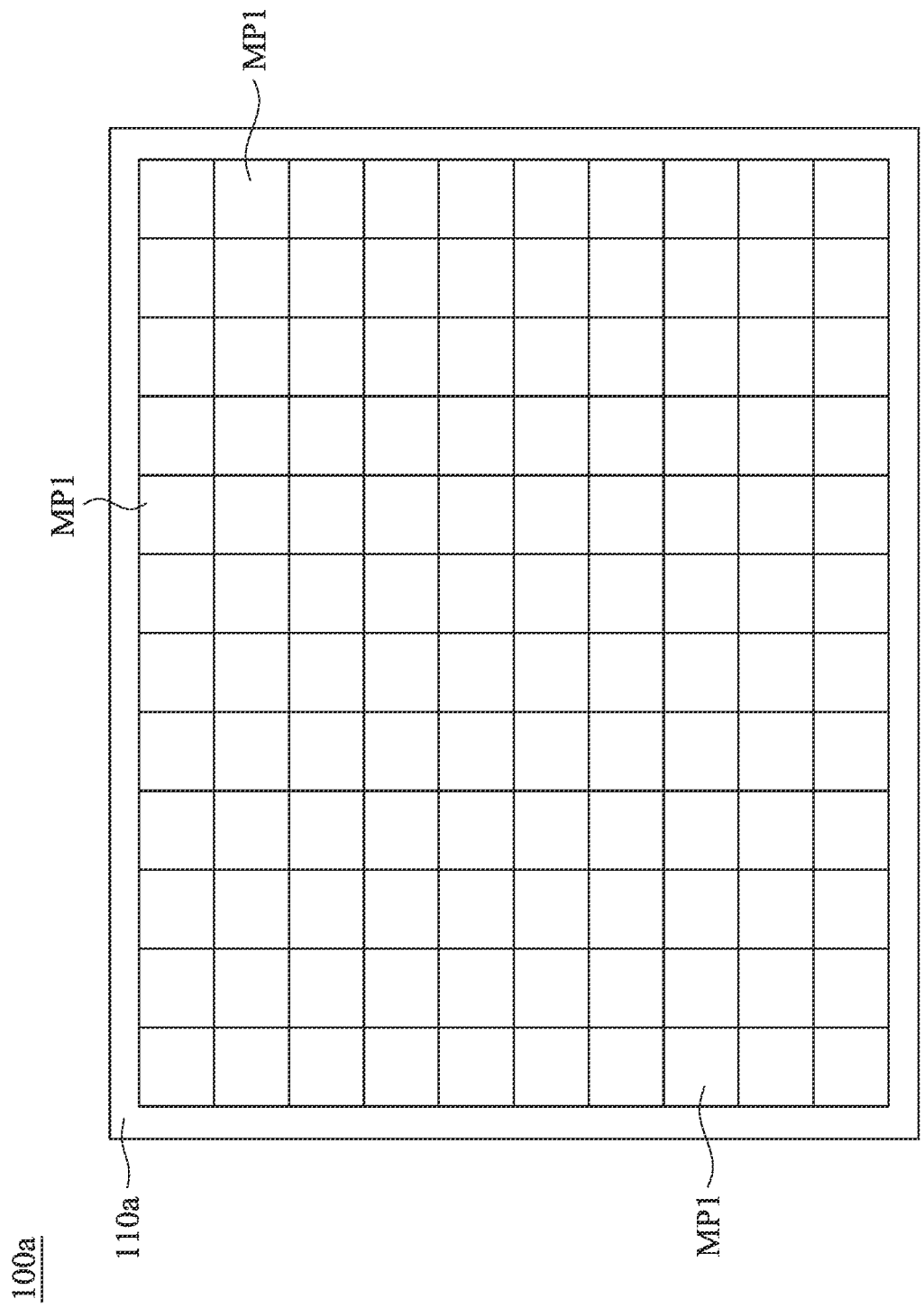
FIG. 1A is a schematic plan view of a light emitting panel according to at least one embodiment of this disclosure.

In the following description, in order to clearly present the technical features of the present disclosure, the dimensions (such as length, width, thickness, and depth) of elements (such as layers, films, substrates, and areas) in the drawings will be enlarged in unusual proportions. Accordingly, the description and explanation of the following embodiments are not limited to the quantities, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape and quantity of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. For example, two objects (e.g., the planes or traces of two substrates) are "substantially parallel" or "substantially perpendicular", where "substantially parallel" and "substantially perpendicular" mean that the parallelism and the perpendicularity respectively between the two objects may include non-parallelism and non-perpendicularity due to the permissible deviation.

In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

FIG. 1A is a schematic plan view of a light emitting panel according to at least one embodiment of this disclosure. Referring to FIG. 1A, a light emitting panel 100a can be used for a display or a light module (such as a backlight module) and includes a circuit substrate 110a. The circuit substrate 110a has a plurality of main pixel areas MP1, and the main pixel areas MP1 may be arranged in an array, as shown in FIG. 1A.

When the light emitting panel 100a is used for a display, the single light emitting panel 100a can be made into one display. Alternatively, a plurality of light emitting panels 100a can merge into a tiled display. Hence, the circuit substrate 110a can have dozens, hundreds, thousands or tens of thousands main pixel areas MP1, where the circuit substrate 110a having 120 main pixel areas MP1 shown in FIG. 1A is not limited to the quantity of the main pixel areas MP1 that the circuit substrate 110a has.

Figure 1B:
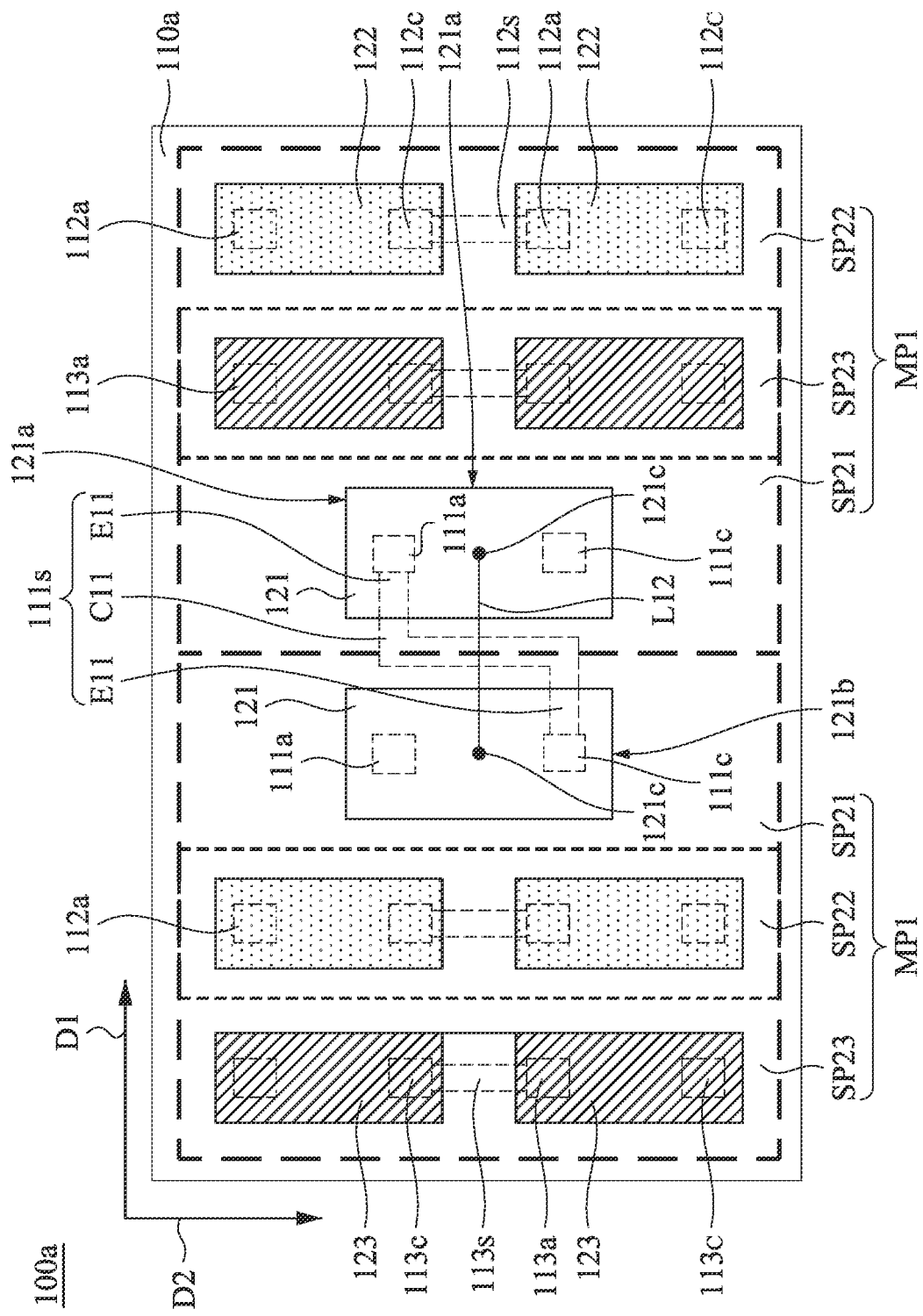
FIG. 1B is a partial schematic plan view of two adjacent main pixel areas in FIG. 1A.

FIG. 1B is a partial schematic plan view of two adjacent main pixel areas in FIG. 1A. Referring to FIG. 1B, each of the main pixel areas MP1 is divided into a plurality of subpixel area. Taking FIG. 1B for example, each of the main pixel areas MP1 can be divided into three subpixel areas: a first subpixel area SP21, a second subpixel area SP22 and a third subpixel area SP23. In one of the main pixel areas MP1, the first subpixel area SP21, the second subpixel area SP22 and the third subpixel area SP23 can be arranged in a first direction D1, in which the first direction D1 in FIG. 1B may be a horizontal direction, but not limited to the horizontal direction only.

The first subpixel areas SP21 of two adjacent main pixel areas MP1 are adjacent to each other and arranged in the first direction D1. In FIG. 1B, the order from left to right of the subpixel areas in two adjacent main pixel areas MP1 is the third subpixel area SP23, the second subpixel area SP22, the first subpixel area SP21, the first subpixel area SP21, the third subpixel area SP23 and the second subpixel area SP22. The two main pixel areas MP1 shown in FIG. 1B can be regarded as the pixel units of the light emitting panel 100a. That is, the two main pixel areas MP1 shown in FIG. 1B repeatedly arranged in an array can form the main pixel areas MP1 shown in FIG. 1A.

In the embodiment, each first subpixel area SP21, each second subpixel area SP22 and each third subpixel area SP23 may take the shape of a strip apiece. Taking FIG. 1B for example, each first subpixel area SP21, each second subpixel area SP22 and each third subpixel area SP23 can extend in a second direction D2, where the second direction D2 is not parallel to the first direction D1. For example, the second direction D2 in FIG. 1B may be a vertical direction and perpendicular to the first direction D1, but the second direction D2 is not limited to the vertical direction only.

The light emitting panel 100a further includes a plurality of first light emitting components 121, a plurality of second light emitting components 122 and a plurality of third light emitting components 123, in which the first light emitting components 121, the second light emitting components 122 and the third light emitting components 123 may be LEDs, such as micro LEDs (μLEDs) or mini LEDs.

The first light emitting components 121, the second light emitting components 122 and the third light emitting components 123 are disposed on the circuit substrate 110a. The first light emitting components 121 are located in the first subpixel areas SP21 respectively, the second light emitting components 122 are located in the second subpixel areas SP22 respectively, and the third light emitting components 123 are located in the third subpixel areas SP23 respectively.

In two first subpixel areas SP21 which are adjacent to each other, the first light emitting components 121 can be arranged in the first direction D1. However, the second light emitting components 122 in one of the second subpixel areas SP22 can be arranged in the second direction D2, and the third light emitting components 123 in one of the third subpixel areas SP23 also can be arranged in the second direction D2.

The first light emitting component 121, the second light emitting component 122 and the third light emitting component 123 can emit light with various colors. For example, the first light emitting component 121 can be a red LED emitting red light, the second light emitting component 122 can be a green LED emitting green light, and the third light emitting component 123 can be a blue LED emitting blue light. Accordingly, the first light emitting components 121, the second light emitting components 122 and the third light emitting components 123 can emit red light, green light and blue light respectively, so that the light emitting panel 100a can display images. In addition, since the first light emitting components 121, the second light emitting components 122 and the third light emitting components 123 can emit red light, green light and blue light respectively, the first subpixel areas SP21, the second subpixel areas SP22 and the third subpixel areas SP23 can be regarded as red pixels, green pixels and blue pixels respectively.

The first light emitting components 121 in two adjacent first subpixel areas SP21 are electrically connected in series, and the circuit substrate 110a can include a plurality of control circuits (not shown), in which the two first light emitting components 121 adjacent to each other and electrically connected in series can be electrically connected to one of the control circuits. Hence, the two first light emitting components 121 electrically connected in series can be controlled by one of the control circuits to emit light. In addition, the control circuit can include at least one transistor, such as a thin film transistor (TFT).

The circuit substrate 110a can further include a plurality of pads 111a, 111c and traces 111s, in which FIG. 1B depicts two pads 111a, two pads 111c and one trace 111s. The trace 111s can be located below the pads 111a and 111c and electrically connected to one pad 111a and one pad 111c. For example, the trace 111s can be electrically connected to one pad 111a and one pad 111c by using two contact windows (not shown). In addition, an insulation layer (not shown) can exist between the trace 111s and both of the pads 111a and 111c, and the contact windows can pass through the insulation layer and thus be electrically connected to the pads 111a and 111c.

Each of the pads 111a and 111c can take the shape of a rectangle, and the trace 111s can take the shape of a polyline. In addition, the trace 111s can have a middle segment C11 and two extension segments E11. The two ends of the middle segment C11 are connected to the extension segments E11 respectively and located between the extension segments E11, in which the middle segment C11 can extend in the second direction D2, and each of the extension segments E11 can extend in the first direction D1, as shown in FIG. 1B.

The pads 111a, 111c and the traces 111s are located in the first subpixel areas SP21 and electrically connected to the first light emitting components 121. For example, the first light emitting components 121 can be mounted on the circuit substrate 110a by flip-chip bonding and electrically connected to the pads 111a and 111c via solder. In two first subpixel areas SP21 adjacent to each other, the pads 111a, 111c and the trace 111s are electrically connected to the electrodes (not shown) of the two first light emitting components 121.

Taking FIG. 1B for example, by using solder, each pad 111a is electrically connected to the anode of the first light emitting component 121, whereas each pad 111c is electrically connected to the cathode of the first light emitting component 121. Since the trace 111s is electrically connected to the pads 111a and 111c, the trace 111s can be electrically connected to two first light emitting components 121, in which the cathode of one first light emitting component 121 and the anode of the other first light emitting component 121 are electrically connected to one trace 111s, so that the two first light emitting components 121 are electrically connected in series via the trace 111s.

When the pad 111a which is not connected to the trace 111s (e.g., the pad 111a at the upper left in FIG. 1B) supplies positive voltage to the anode of the first light emitting component 121, forward biases will be generated in the two first light emitting components 121 which are electrically connected in series, so that the first light emitting components 121 can emit light. In addition, in the two first subpixel areas SP21 adjacent to each other, the pad 111a which is not connected to the trace 111s (e.g., the pad 111a at the upper left in FIG. 1B) can be electrically connected to the control circuit, so that the control circuit can control the first light emitting components 121 electrically connected in series to emit light.

Multiple second light emitting components 122 can be located in one of the second subpixel areas SP22 and electrically connected in series. Multiple third light emitting components 123 can be located in one of the third subpixel areas SP23 and electrically connected in series. In addition, in the embodiment as shown in FIG. 1B, the circuit substrate 110a may further include a plurality of pads 112a, 113a, 112c and 113c and a plurality of traces 112s and 113s, in which the traces 112s and 113s can be located below the pads 112a, 113a, 112c and 113c. The trace 112s is electrically connected to one pad 112a and one pad 112c, whereas the trace 113s is electrically connected to one pad 113a and one pad 113c. The traces 112s and 113s can be electrically connected to the pads 112a, 112c and the pads 113a, 113c by using contact windows (not shown).

The pads 112a, 112c and the traces 112s are located in the second subpixel areas SP22 and electrically connected to the second light emitting components 122. The pads 113a, 113c and the traces 113s are located in the third subpixel areas SP23 and electrically connected to the third light emitting components 123. The second light emitting components 122 and the third light emitting components 123 can be mounted on the circuit substrate 110a by using flip-chip bonding and electrically connected to the pads 112a, 112c, 113a and 113c by using solder. In one of the main pixel areas MP1, the pads 112a, 112c and the traces 112s are electrically connected to the electrodes (not shown) of two second light emitting components 122, and the pads 113a, 113c and the traces 113s are electrically connected to the electrodes (not shown) of two third light emitting components 123, so that the two second light emitting components 122 are electrically connected in series, and the two third light emitting components 123 are electrically connected in series.

Taking FIG. 1B for example, in one of the second subpixel areas SP22, the anode and the cathode of each of the second light emitting components 122 are electrically connected to the pads 112a and 112c respectively via solder. Since the trace 112s is electrically connected to the pads 112a and 112c, the second light emitting components 122 in the second subpixel area SP22 can be electrically connected in series via the trace 112s. Likewise, in one of the third subpixel areas SP23, the anode and the cathode of each of the third light emitting components 123 are electrically connected to the pads 113a and 113c via solder. Since the trace 113s is electrically connected to the pads 113a and 113c, the third light emitting components 123 in the third subpixel area SP23 also can be electrically connected in series via the trace 113s.

When the pad 112a which is not connected to the trace 112s (e.g., the upper pad 112a in FIG. 1B) supplies positive voltage to the anode of the second light emitting component 122, forward biases will be generated in the two second light emitting components 122 which are electrically connected in series, so that the second light emitting components 122 can emit light. Likewise, when the pad 113a which is not connected to the trace 113s (e.g., the upper pad 113a in FIG. 1B) supplies positive voltage to the anode of the third light emitting component 123, forward biases will be generated in the two third light emitting components 123 which are electrically connected in series, so that the third light emitting components 123 can emit light.

In addition, one of the pads 112a (e.g., the upper pad 112a in FIG. 1B) in one second subpixel area SP22 and one of the pads 113a (e.g., the upper pad 113a in FIG. 1B) in one third subpixel area SP23 can be electrically connected to the two control circuits respectively, so that each control circuit can control the two second light emitting components 122 electrically connected in series or the two third light emitting components 123 electrically connected in series to emit light.

The first light emitting components 121, the second light emitting components 122 and the third light emitting components 123 can take the shape of a strip apiece. Taking FIG. 1B for example, each of the first light emitting components 121 can have a pair of long sides 121a opposite to each other and a pair of short sides 121b opposite to each other, in which the long sides 121a are connected to the short sides 121b. In two first subpixel areas SP21 adjacent to each other, the short side 121b of one first light emitting component 121 can be flush with the short side 121b of the other first light emitting component 121, and a connective line L12 formed between the centroids of the first light emitting components 121 can be substantially parallel to the first direction D1, as shown in FIG. 1B.

In the present embodiment, the current efficiency of each of the first light emitting components 121 may be less than the current efficiency of each of the second light emitting components 122 and also may be less than the current efficiency of each of the third light emitting components 123. Hence, the first light emitting component 121 has the least current efficiency among the first light emitting component 121, the second light emitting component 122 and the third light emitting component 123.

Moreover, seeing from FIG. 1B, the size of each of the first light emitting components 121 is larger than the size of each of the second light emitting components 122 and also larger than the size of each of the third light emitting components 123, so the light-emitting surface of each of the first light emitting components 121 is larger than the light-emitting surface of each of the second light emitting components 122 and also larger than the light-emitting surface of each of the third light emitting components 123. Hence, even if the first light emitting component 121 has low current efficiency, the shining first light emitting component 121 can provide light having sufficient brightness due to the larger light-emitting surface.

It is particular to note that in another embodiment, the light-emitting wavelength of each of the first light emitting components 121 can be lower than the light-emitting wavelength of each of the second light emitting components 122 and also can be lower than the light-emitting wavelength of each of the third light emitting components 123. Accordingly, the first light emitting components 121 can have the lowest light-emitting wavelength among the first light emitting component 121, the second light emitting component 122 and the third light emitting component 123.

Specifically, the first light emitting component 121 can be a blue LED emitting blue light, the second light emitting component 122 can be a green LED emitting green light, and the third light emitting component 123 can be a red LED emitting red light, so the first light emitting component 121 has the lowest light-emitting wavelength. Since the human eye of a normal person has a low sense on blue light, it is not easy for normal people to detect blue light. In the present embodiment, since the first light emitting components 121, which are electrically connected in series and emit blue light, have the largest size and the largest light-emitting surface apiece, the first light emitting components 121 can provide blue light having sufficient brightness to cause a user to detect blue light easily, thereby facilitating color enhancement of images of display.

It is noted that in the above embodiment, the first light emitting component 121, the second light emitting component 122 and the third light emitting components 123 are mounted on the circuit substrate 110a by flip-chip bonding. However, in another embodiment, the first light emitting component 121, the second light emitting component 122 and the third light emitting component 123 can be mounted on the circuit substrate 110a by wire-bonding. Thus, each of the first light emitting component 121, the second light emitting component 122 and third light emitting component 123 is not limited to be mounted on the circuit substrate 110a by flip-chip bonding.

Figure 1C:
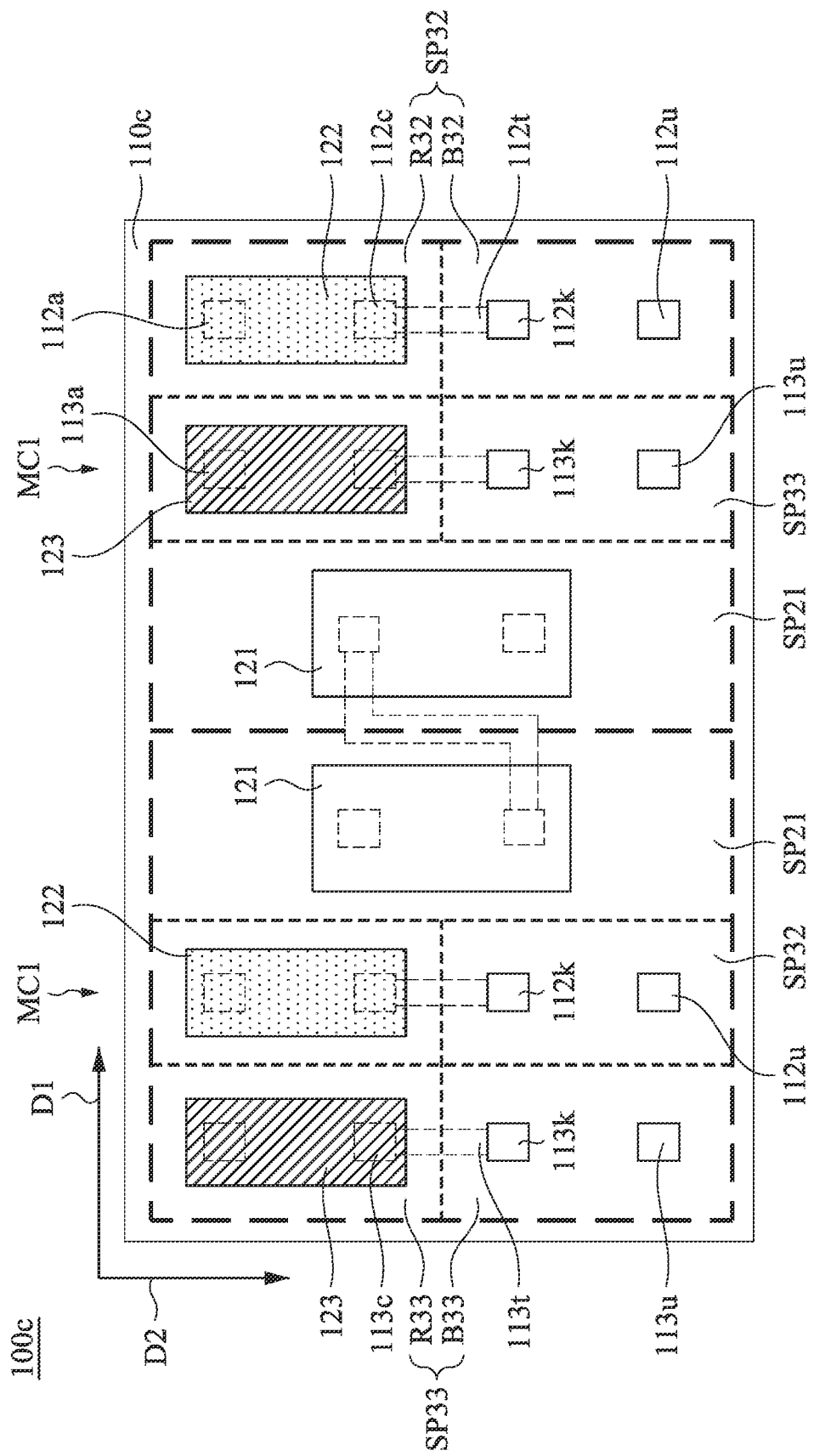
FIG. 1C is a partial schematic plan view of a light emitting panel according to at least one embodiment of this disclosure.

FIG. 1C is a partial schematic plan view of a light emitting panel according to at least one embodiment of this disclosure. Referring to FIG. 10, the light emitting panel 100c includes a circuit substrate 110c, a plurality of first light emitting components 121, a plurality of second light emitting components 122 and a plurality of third light emitting components 123. The light emitting panel 100c of the present embodiment is similar to the light emitting panel 100a of the previous embodiment. Accordingly, the differences between the light emitting panels 100c and 100a are mainly described below. The similarity between the light emitting panels 100c and 100a is basically not repeated.

Unlike the light emitting panel 100a, at least one subpixel area of the light emitting panel 100c has a subpixel regular region and a subpixel spare region. Taking FIG. 10 for example, the circuit substrate 110c has a plurality of main pixel areas MC1, and each of the main pixel areas MC1 is divided into a first subpixel area SP21, a second subpixel area SP32 and a third subpixel area SP33. At least one of the second subpixel areas SP32 is divided into a second-subpixel regular region R32 and a second-subpixel spare region B32, whereas at least one of the third subpixel areas SP33 is divided into a third-subpixel regular region R33 and a third-subpixel spare region B33. At least one of the second light emitting components 122 is disposed in the second-subpixel regular region R32, and at least one of the third light emitting components 123 is disposed in the third-subpixel regular region R33.

The circuit substrate 110c can include a plurality of pads 112a, 112c, 113a, 113c, a plurality of spare pads 112k, 112u, 113k and 113u, and a plurality of traces 112t and 113t, in which the pads 112a, 112c, the spare pads 112k and 112u, and the traces 112t are all disposed in the second subpixel area SP32, whereas the pads 113a, 113c, the spare pads 113k and 113u, and the traces 113t are disposed in the third subpixel area SP33. In addition, the pads 112a and 113a also can be electrically connected to two control circuits respectively.

In one of the second subpixel areas SP32, the pads 112a and 112c are located in the second-subpixel regular region R32, whereas the spare pads 112k are 112u are located in the second-subpixel spare region B32. The trace 112t is located across the second-subpixel regular region R32 and the second-subpixel spare region B32 that are adjacent to each other. The trace 112t is located below both the pad 112c and the spare pad 112k, where the trace 112t can be electrically connected to one pad 112c and one spare pad 112k via contact windows (not shown).

Similar to the second subpixel area SP32, in one of the third subpixel areas SP33, the pads 113a and 113c are located in the third-subpixel regular region R33, whereas the spare pads 113k and 113u are located in the third-subpixel spare region B33. The trace 113t is located across the third-subpixel regular region R33 and the third-subpixel spare region B33 that are adjacent to each other and located below the pad 113c and the spare pad 113k, in which the trace 113t can be electrically connected to one pad 113c and one spare pad 113k by using contact windows (not shown).

In one of the second-subpixel regular regions R32, the second light emitting component 122 can be electrically connected to the pads 112a and 112c by flip-chip bonding or wire bonding, where the anode of the second light emitting component 122 is electrically connected to the pad 112a, and the cathode of the second light emitting component 122 is electrically connected to the pad 112c. Accordingly, when the pad 112a supplies positive voltage to the anode of the second light emitting component 122, the second light emitting component 122 can emit light, such as green light.

For the same reason, in one of the third-subpixel regular regions R33, the third light emitting component 123 also can be electrically connected to the pads 113a and 113c by flip-chip bonding or wire bonding, where the anode of the third light emitting component 123 is electrically connected to the pad 113a, and the cathode of the third light emitting component 123 is electrically connected to the pad 113c. Hence, when the pad 113a supplies positive voltage to the anode of the third light emitting component 123, the third light emitting component 123 can emit light, such as blue light. In addition, since the pads 112a and 113a can be electrically connected to two control circuits respectively, two control circuits can control the second light emitting component 122 and the third light emitting component 123 to emit light.

The second-subpixel spare region B32 and the third-subpixel spare region B33 can provide where another second light emitting component 122 and another third light emitting component 123 are disposed, in which the anode and the cathode of the second light emitting component 122 can be electrically connected to the spare pads 112u and 112k in the second-subpixel spare region B32 respectively, while the anode and the cathode of the third light emitting component 123 can be electrically connected to the spare pads 113u and 113k in the third-subpixel spare region B33 respectively. When the spare pads 112u and 113u provide positive voltage to the anodes of both the second light emitting component 122 and the third light emitting component 123 respectively, the second light emitting component 122 and the third light emitting component 123 can emit light.

The trace 112t is electrically connected to the pad 112c and the spare pad 113k, and the trace 113t is electrically connected to the pad 113c and the spare pad 113k, so if the two second light emitting components 122 are disposed in the second-subpixel regular region R32 and the second-subpixel spare region B32 of one of the second subpixel areas SP32 respectively, the two second light emitting components 122 will be electrically connected in parallel. Likewise, if the two third light emitting components 123 are disposed in the third-subpixel regular region R33 and third-subpixel spare region B33 of one of the third subpixel areas SP33 respectively, the two third light emitting components 123 will also be electrically connected in parallel.

From this it can be seen that when the second light emitting component 122 in the second-subpixel regular region R32 of one of the second subpixel areas SP32 fails, a normal second light emitting component 122 can be disposed in the second-subpixel spare region B32 of the same second subpixel area SP32 to replace the failing second light emitting component 122 in the second-subpixel regular region R32. For the same reason, when the third light emitting component 123 in the third-subpixel regular region R33 of one of the third subpixel areas SP33 fails, a normal third light emitting component 123 can be disposed on the third-subpixel spare region B33 of the same third subpixel area SP33 to replace the failing third light emitting component 123 in the third-subpixel regular region R33.

The spare pads 112u and 113u can be electrically connected to two control circuits respectively, so that the two control circuits can control the second light emitting component 122 in the second-subpixel spare region B32 and the third light emitting component 123 in the third-subpixel spare region B33 to emit light. In addition, one control circuit can be electrically connected to the pad 112a and the spare pad 112u, and the other control circuit can be electrically connected to the pad 113a and the spare pad 113u.

It is necessary to note that when the second light emitting component 122 and the third light emitting component 123 in the second-subpixel regular region R32 and the third-subpixel regular region R33 work normally, no second light emitting component 122 and no third light emitting component 123 will be disposed in the second-subpixel spare region B32 and the third-subpixel spare region B33, as shown in FIG. 1C.

In addition, in one of the main pixel areas MC1, the second-subpixel regular region R32 and the second-subpixel spare region B32 can be arranged in the second direction D2, while the third-subpixel regular region R33 and the third-subpixel spare region B33 also can be arranged in the second direction D2. Hence, the arrangement direction of the second-subpixel regular region R32 and the second-subpixel spare region B32 and the arrangement direction of the third-subpixel regular region R33 and the third-subpixel spare region B33 are each different form the arrangement direction of the second subpixel area SP32 and the third subpixel area SP33 in the same main pixel areas MC1.

It is necessary to note that in the present embodiment, the anode and the cathode of the second light emitting component 122 are electrically connected to the pads 112a and 112c respectively, while the anode and the cathode of the third light emitting component 123 are electrically connected to the pads 113a and 113c respectively, in which the pads 112a, 113a and the spare pads 112u, 113u can supply positive voltage, but the pads 112c, 113c and the spare pads 112k and 113k do not supply positive voltage.

However, in another embodiment, the anode and the cathode of the second light emitting component 122 can be electrically connected to the pads 112c and 112a respectively, and the anode and the cathode of the third light emitting component 123 can be electrically connected to the pads 113c and 113a respectively, in which the pads 112c, 113c and the spare pads 112k, 113k can supply positive voltage, but the pads 112a, 113a and the spare pads 112u, 113u do not supply positive voltage. Accordingly, the anodes of both the second light emitting component 122 and the third light emitting component 123 are not limited to be electrically connected to the pads 112a, 113a and the spare pads 112u, 113u, while the cathodes of both of them are not limited to be electrically connected to the pads 112c, 113c and the spare pads 112k, 113k.

Figure 1D:
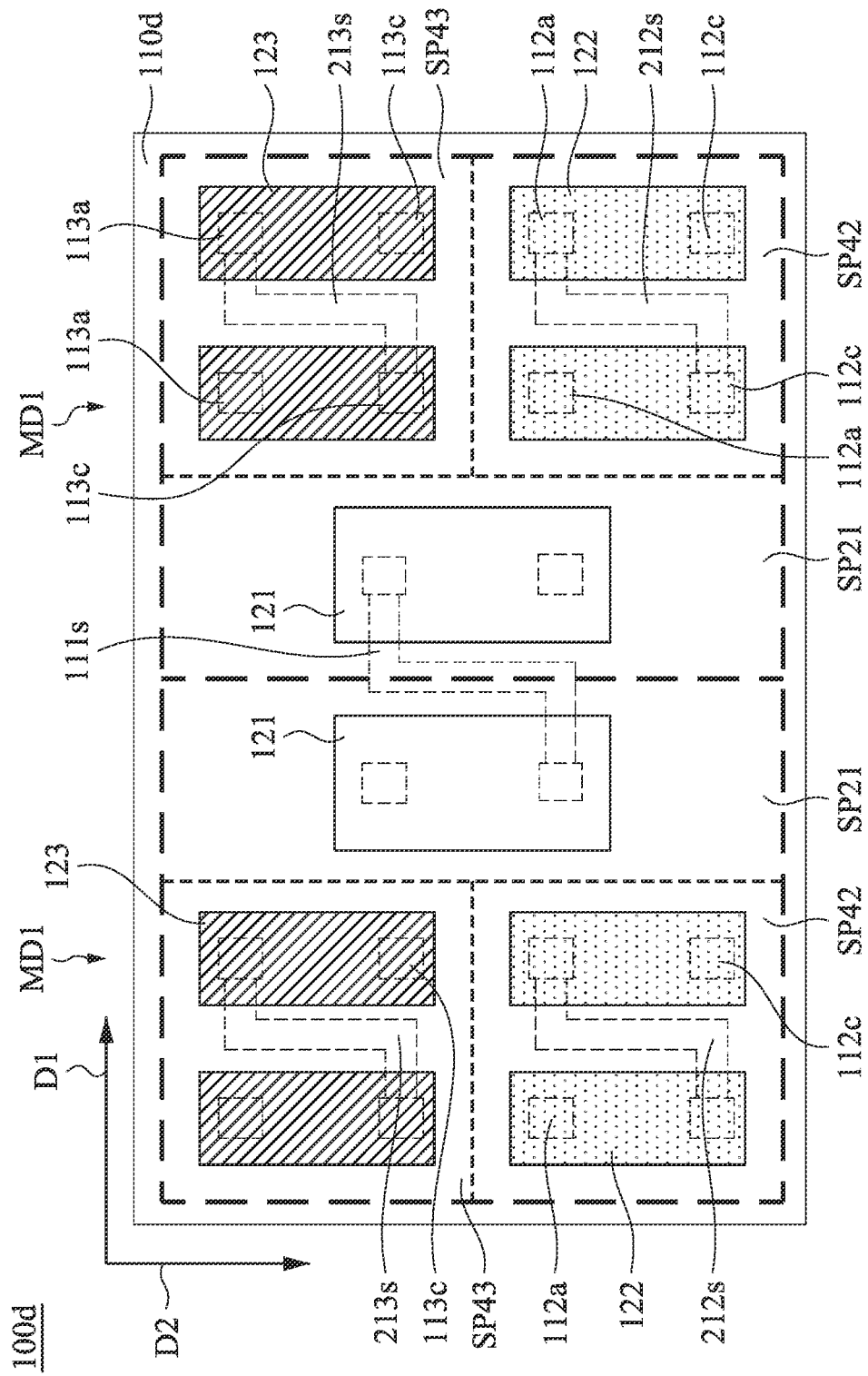
FIG. 1D is a partial schematic plan view of a light emitting panel according to at least one embodiment of this disclosure.

FIG. 1D is a partial schematic plan view of a light emitting panel according to at least one embodiment of this disclosure. Referring to FIG. 1D, the light emitting panel 100d of the present embodiment is similar to the light emitting panel 100a of the previous embodiment. For this reason, the differences between the light emitting panels 100d and 100a are mainly described below while the similarity between the light emitting panels 100d and 100a is basically not repeated.

In the light emitting panel 100d, the circuit substrate 110d has a plurality of main pixel areas MD1, and each of the main pixel areas MD1 can be divided into a first subpixel area SP21, a second subpixel area SP42 and a third subpixel area SP43. Unlike the circuit substrate 110a, in one of the main pixel areas MD1, the second subpixel area SP42 and the third subpixel area SP43 are arranged in the second direction D2, in which the second subpixel area SP42 and the third subpixel area SP43 can take the shape of a square or a rectangle like square, as shown in FIG. 1D.

The circuit substrate 110d includes a plurality of pads 112a, 113a, 112c, 113c and a plurality of traces 212s and 213s, where the pads 112a, 112c and the traces 212s are located in the second subpixel areas SP42, and the pads 113a, 113c and the traces 213s are located in the third subpixel areas SP43. At least two second light emitting components 122 can be disposed in one of the second subpixel areas SP42. In one of the second subpixel areas SP42, the anode and the cathode of each second light emitting component 122 are electrically connected to the pads 112a and 112c respectively, and the trace 212s can be electrically connected to one pad 112a and one pad 112c by using contact windows (not shown), so that the two second light emitting components 122 are electrically connected in series.

Likewise, at least two third light emitting components 123 can be disposed in one of the third subpixel areas SP43. In one of the third subpixel areas SP43, the anode and the cathode of each of the third light emitting components 123 are electrically connected to the pads 113a and 113c respectively, while the trace 213s can be electrically connected to one pad 113a and one pad 113c by using contact windows (not shown), so that the two third light emitting components 123 are electrically connected in series. In addition, unlike the previous traces 112s and 113s, the traces 212s and 213s can take the shape of a polyline apiece, in which the shape of each of the traces 212s and 213s can be the same as the shape of the trace 111s in the first subpixel area SP21.

Figure 1E:
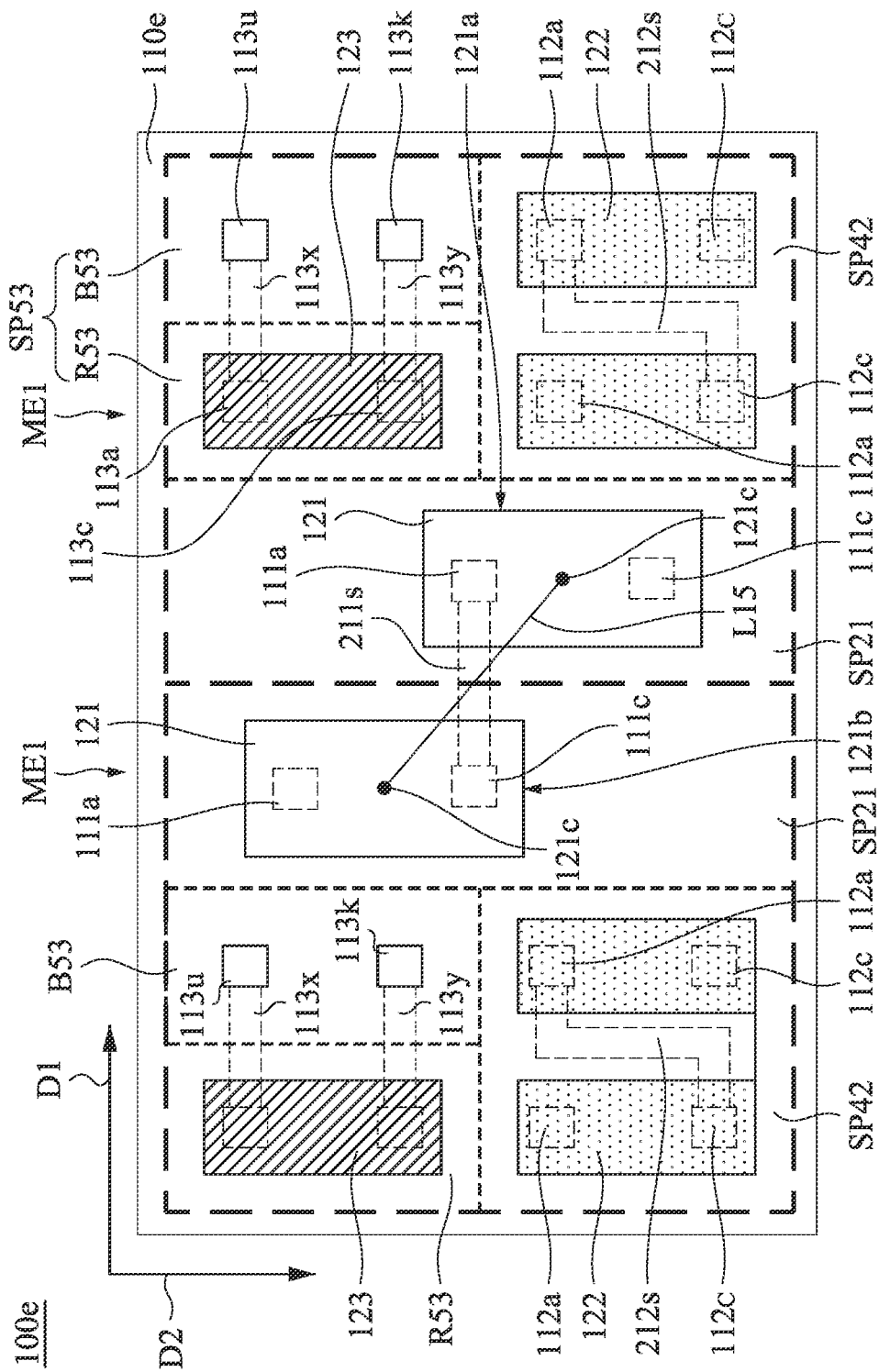
FIG. 1E is a partial schematic plan view of a light emitting panel according to at least one embodiment of this disclosure.

FIG. 1E is a partial schematic plan view of a light emitting panel according to at least one embodiment of this disclosure. Referring to FIG. 1E, the light emitting panel 100e of the present embodiment is similar to the light emitting panel 100d as shown in FIG. 1D. For example, the light emitting panel 100e includes a circuit substrate 110e. The circuit substrate 110e has a plurality of main pixel areas ME1 while each of the main pixel areas ME1 can be divided into a first subpixel area SP21, a second subpixel area SP42 and a third subpixel area SP53, where in two first subpixel areas SP21 adjacent to each other, the first light emitting components 121 are arranged in the first direction D1.

The differences between the light emitting panels 100d and 100e are mainly described below and the similarity of both is basically not repeated. Specifically, in the light emitting panel 100e and in two adjacent first subpixel areas SP21, any one of the first light emitting components 121 can protrude from the short side 121b of another first light emitting component 121, and a connective line L15 formed between the centroids 121c of the two first light emitting components 121 is parallel to neither the first direction D1 nor the second direction D2. Hence, the short sides 121b of the two adjacent first light emitting components 121 electrically connected in series are not flush with each other, and the two first light emitting components 121 are distributed in dislocation. In this way, it can facilitate the uniform distribution of the first light emitting components 121, the second light emitting components 122 and the third light emitting components 123, so as to enhance the quality of images.

Since any one of the first light emitting components 121 protrudes from one of the short sides 121b of another first light emitting component 121, the trace 211s used for electrically connecting the first light emitting components 121 in series can take the shape of a rectangle and extend in the first direction D1, where the trace 211s is located below the pads 111a and 111c and can be electrically connected to the pad 111a in one of the first subpixel areas SP21 and the pad 111c in another first subpixel area SP21 via contact windows. In contrast to the trace 111s in the previous embodiment, the trace 211s not only has a simple shape and thus reduces the difficulty of circuit design, but also can shorten the conductive path between the first light emitting components 121, thereby promoting decrease in the impedance among the first light emitting components 121.

The third subpixel area SP53 is different from the third subpixel area SP43 in FIG. 1D. Specifically, each of the third subpixel area SP53 is divided into a third-subpixel regular region R53 and a third-subpixel spare region B53. In one of the main pixel areas ME1, the third-subpixel regular region R53 and the third-subpixel spare region B53 are arranged in the first direction D1.

The circuit substrate 110e can include a plurality of pads 113a, 113c, a plurality of spare pads 113k, 113u and a plurality of traces 113x and 113y, in which the pads 113a, 113c, the spare pads 113k, 113u and the traces 113x and 113y are located in the third subpixel areas SP53 and electrically connected to the third light emitting components 123.

The pads 113a and 113c are located in the third-subpixel regular region R53, whereas the spare pads 113u and 113k are located in the third-subpixel spare region B53. Each of the traces 113x and 113y is located across the third-subpixel regular region R53 and the third-subpixel spare region B53 that are adjacent to each other. Each of the traces 113x and 113y can extend in the first direction D1 and be arranged in the second direction D2, in which each of the traces 113x is electrically connected to the adjacent pads 113a and 113u, and each of the traces 113y is electrically connected to the adjacent pads 113c and 113k.

The anode of each of the third light emitting components 123 can be electrically connected to the pads 113a, and the cathode of each of the third light emitting components 123 can be electrically connected to the pads 113c. If two third light emitting components 123 are respectively disposed in the third-subpixel regular region R53 and the third-subpixel spare region B53 of one of the third subpixel areas SP53, where the anodes of the two third light emitting components 123 are electrically connected to the pads 113a and 113u respectively, and the cathodes of the two third light emitting components 123 are electrically connected to the pads 113c and 113k, the two third light emitting components 123 will be electrically connected in parallel. From this it can be seen that when the third light emitting component 123 in the third-subpixel regular region R53 of one of the third subpixel areas SP53 fails, a normal third light emitting component 123 can be disposed in the third-subpixel spare region B53 of the same third subpixel area SP53 to replace the failing third light emitting component 123.

Figure 2A:
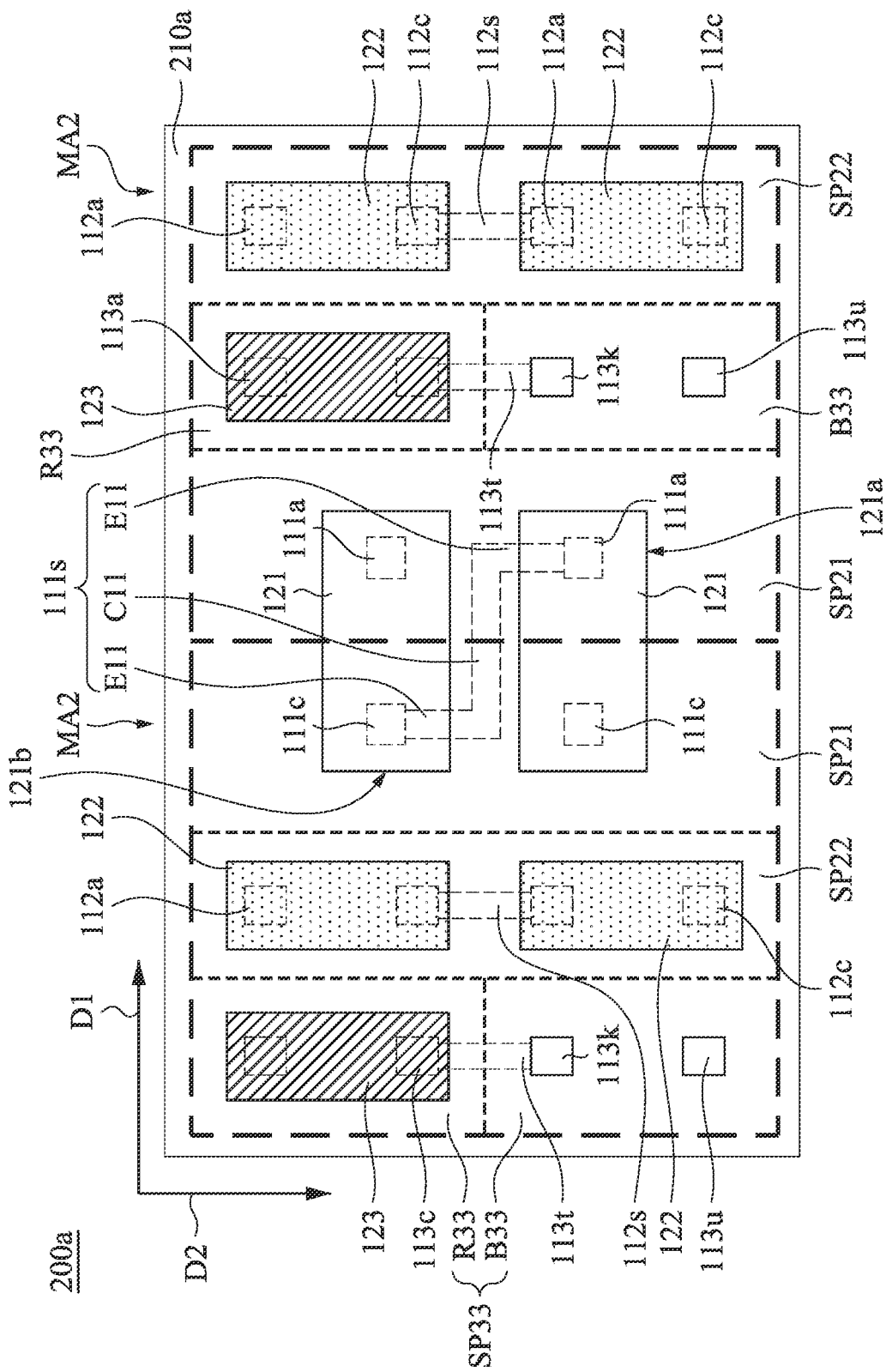
FIG. 2A is a partial schematic plan view of a light emitting panel according to at least one embodiment of this disclosure.

FIG. 2A is a partial schematic plan view of a light emitting panel according to at least one embodiment of this disclosure. Referring to FIG. 2A, the light emitting panel 200a includes a circuit substrate 210a, and the circuit substrate 210a has a plurality of main pixel areas MA2. Each of the main pixel areas MA2 can be divided into a first subpixel area SP21, a second subpixel area SP22 a third subpixel area SP33. The circuit substrate 210a can include pads 112a, 112c, 113a, 113c, traces 112s, 113t and spare pads 113u and 113k. The light emitting panel 200a includes a plurality of second light emitting components 122 electrically connected to the pads 112a, 112c and the traces 112s and a plurality of third light emitting components 123 electrically connected to the pads 113a, 113c and the traces 113t.

The arrangements of the pads 112a, 112c, 113a, 113c, the traces 112s, 113t and the spare pads 113k, 113u and the electric connections of both the second light emitting components 122 and the third light emitting components 123 to the pads 112a, 112c, 113a, 113c, the spare pads 113k and 113u are basically similar to those of the previous embodiment, like the second subpixel area SP22 in FIG. 1B and the third subpixel area SP33 in FIG. 1O. Hence, the light emitting panel 200a is similar to the light emitting panels 100a and 100c of the previous embodiments. The differences between the light emitting panel 200a and the light emitting panels of the previous embodiments are mainly described below, and the similarity is basically not repeated.

Each main pixel area MA2 has a first subpixel area SP21, and the circuit substrate 210a further includes a plurality of pads 111a, 111c and traces 111s, in which the pads 111a, 111c and the trace 111s are disposed in two first subpixel areas SP21 adjacent to each other, and multiple first light emitting components 121 included in the light emitting panel 200a are electrically connected to the pads 111a, 111c and the trace 111s. The trace 111s is located below the pads 111a and 111c and electrically connected to the pad 111a in one first subpixel area SP21 and the pad 111c in the other first subpixel area SP21.

The arrangement of the pads 111a, 111c and the trace 111s in FIG. 2A is different from the previous arrangements of the pads 111a, 111c and the traces 111s in FIGS. 1B to 1D. Specifically, unlike the traces 111s in FIGS. 1B to 1D, in FIG. 2A, the middle segment C11 of the trace 111s extends in the first direction D1, and the extension segment E11 of the trace 111s extends in the second direction D2, as shown in FIG. 2A.

Comparing FIG. 2A and FIG. 1B, it can be understood that the pads 111a, 111c and the trace 111s in FIG. 2A are basically the same as the pads 111a, 111c and the trace 111s in FIG. 1B that is rotated 90 degrees to the right. Hence, the first light emitting components 121 disposed in the two first subpixel areas SP21 adjacent to each other are arranged in the second direction D2, in which each of the long sides 121a of the first light emitting components 121 extends in the first direction D1, and each of the short sides 121b extends in the second direction D2, so that at least one of the first light emitting components 121 can be located across two first subpixel areas SP21 adjacent to each other. Taking FIG. 2A for example, each of the first light emitting components 121 can extend from one first subpixel area SP21 to another first subpixel area SP21.

Figure 2B:
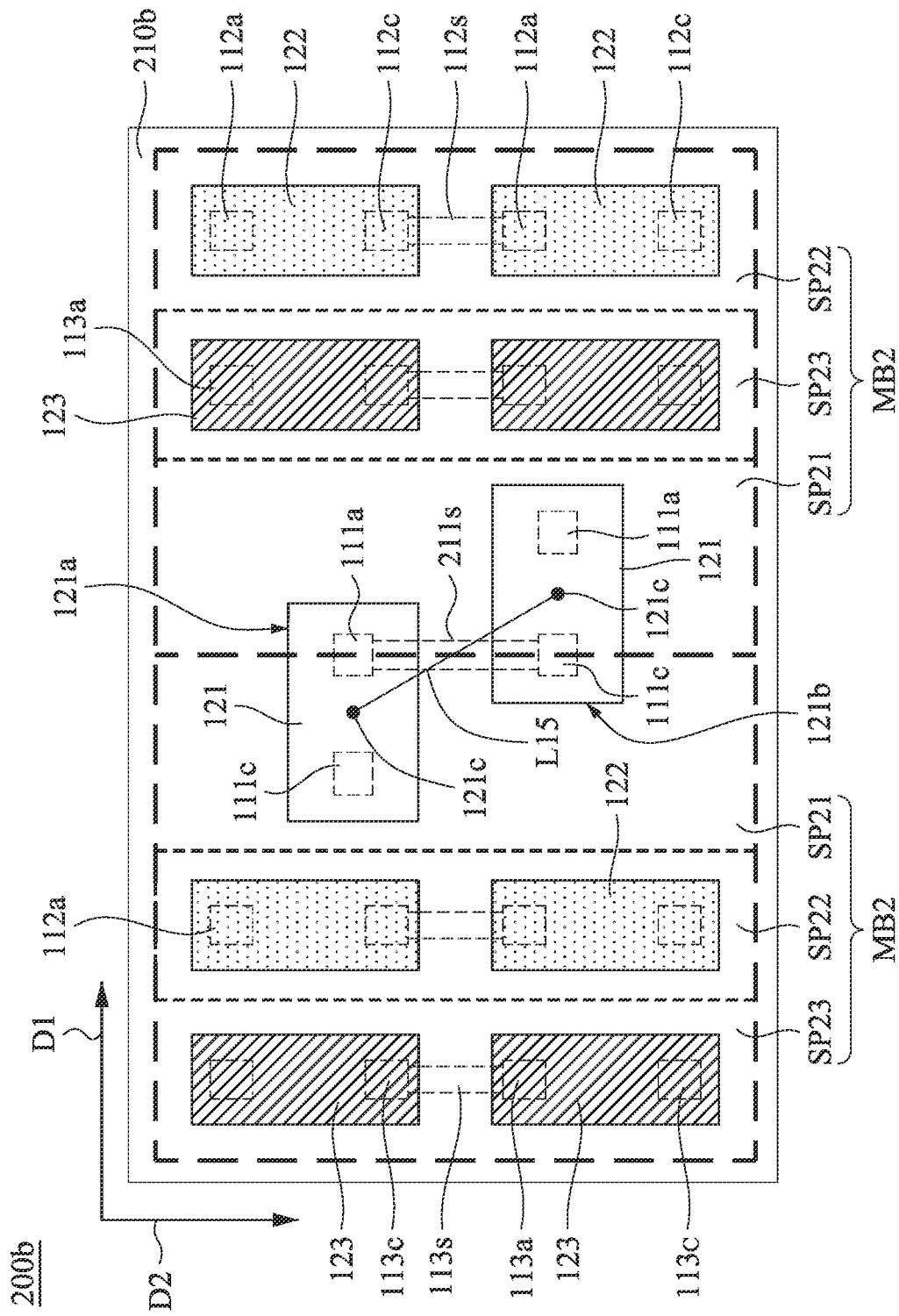
FIG. 2B is a partial schematic plan view of a light emitting panel according to at least one embodiment of this disclosure.

FIG. 2B is a partial schematic plan view of a light emitting panel according to at least one embodiment of this disclosure. Referring to FIG. 2B, the light emitting panel 200b of the present embodiment is similar to the light emitting panel 200a of the previous embodiment, and the differences between the light emitting panels 200b and 200a are mainly described below. The similarity between the light emitting panels 200b and 200a is basically not repeated.

Specifically, the light emitting panel 200b includes a circuit substrate 210b, and the circuit substrate 210b has a plurality of main pixel areas MB2, in which each of the main pixel areas MB2 can be divided into a first subpixel area SP21, a second subpixel area SP22 and a third subpixel area SP23. Unlike the circuit substrate 210a of the previous embodiment, since the main pixel area MB2 has the third subpixel area SP23, so the circuit substrate 210b includes pads 113a, 113c and traces 113s. In other words, the circuit substrate 210b has the third subpixel areas SP23 as shown in FIG. 1B and the pads 113a, 113c and the traces 113s.

Each of the main pixel areas MB2 also has a first subpixel area SP21, and the circuit substrate 210b further includes a plurality of pads 111a, 111c and traces 211s, where the multiple first light emitting components 121 included in the light emitting panel 200b are electrically connected to the pads 111a, 111c and the traces 211s. Unlike the light emitting panel 200a in the previous embodiment, in two adjacent first subpixel areas SP21, any one of the first light emitting components 121 protrudes from one of the short sides 121b of another first light emitting component 121, and a connective line L15 between the centroids 121c of two first light emitting components 121 is parallel to neither the first direction D1 nor the second direction D2.

Comparing FIG. 2B and FIG. 1E, it can be understood that the shapes of the pads 111a, 111c and the trace 211s in FIG. 2B are basically the same as the shapes of the pads 111a, 111c and the trace 111s in FIG. 1B. However, the trace 211s in FIG. 2B extends in the second direction D2, unlike the trace 211s extending in the first direction D1 in FIG. 1E. Hence, in the embodiment shown in FIG. 2B, the first light emitting components 121 disposed in the two first subpixel areas SP21 adjacent to each other also can be arranged in the second direction D2 and extend from one first subpixel area SP21 to another first subpixel area SP21.

Figure 2C:
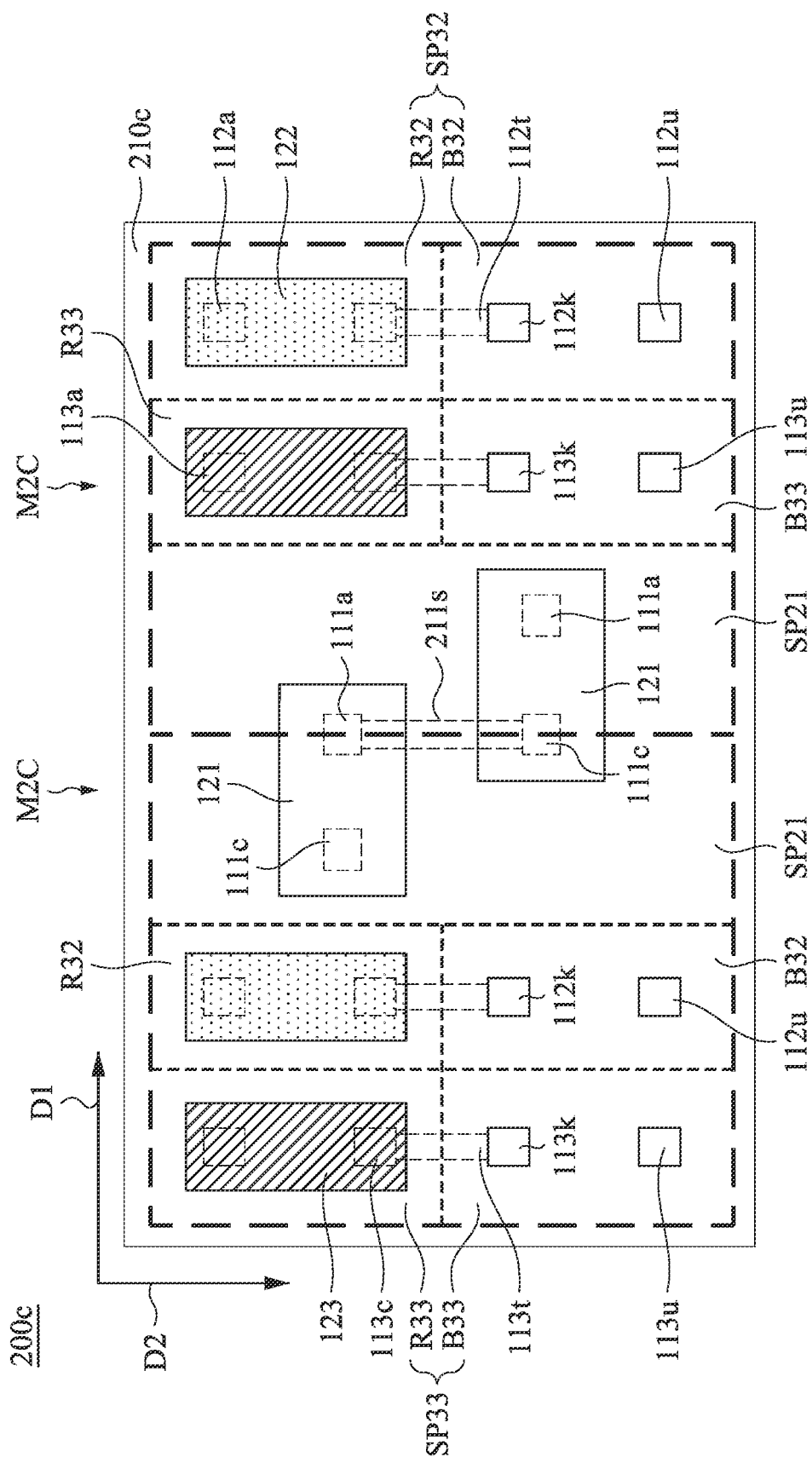
FIG. 2C is a partial schematic plan view of a light emitting panel according to at least one embodiment of this disclosure.

FIG. 2C is a partial schematic plan view of a light emitting panel according to at least one embodiment of this disclosure. Referring to FIG. 2C, the light emitting panel 200c of the present embodiment is similar to the light emitting panel 200b of the previous embodiment, where a circuit substrate 210c included in the light emitting panel 200c has a plurality of main pixel areas MC2, and each of the main pixel areas MC2 can be divided into a first subpixel area SP21, a second subpixel area SP32 and a third subpixel area SP33.

Unlike the previous circuit substrate 210b, since the main pixel area MC2 has the second subpixel area SP32 and the third subpixel area SP33, the circuit substrate 210c further has a second-subpixel regular region R32, a second-subpixel spare region B32, a third-subpixel regular region R33 and a third-subpixel spare region B33, and includes a plurality of pads 112a, 112c, 113a, 113c, a plurality of spare pads 112u, 112k, 113u and 113k and a plurality of traces 112t, 113t and 211s. In addition, the circuit design and functions of the pads 112a, 112c, 113a, 113c, the spare pads 112u, 112k, 113u and 113k and the trace 112t, 113t and 211s are described in the previous embodiment of FIG. 10 and thus are not repeated.

Figure 2D:
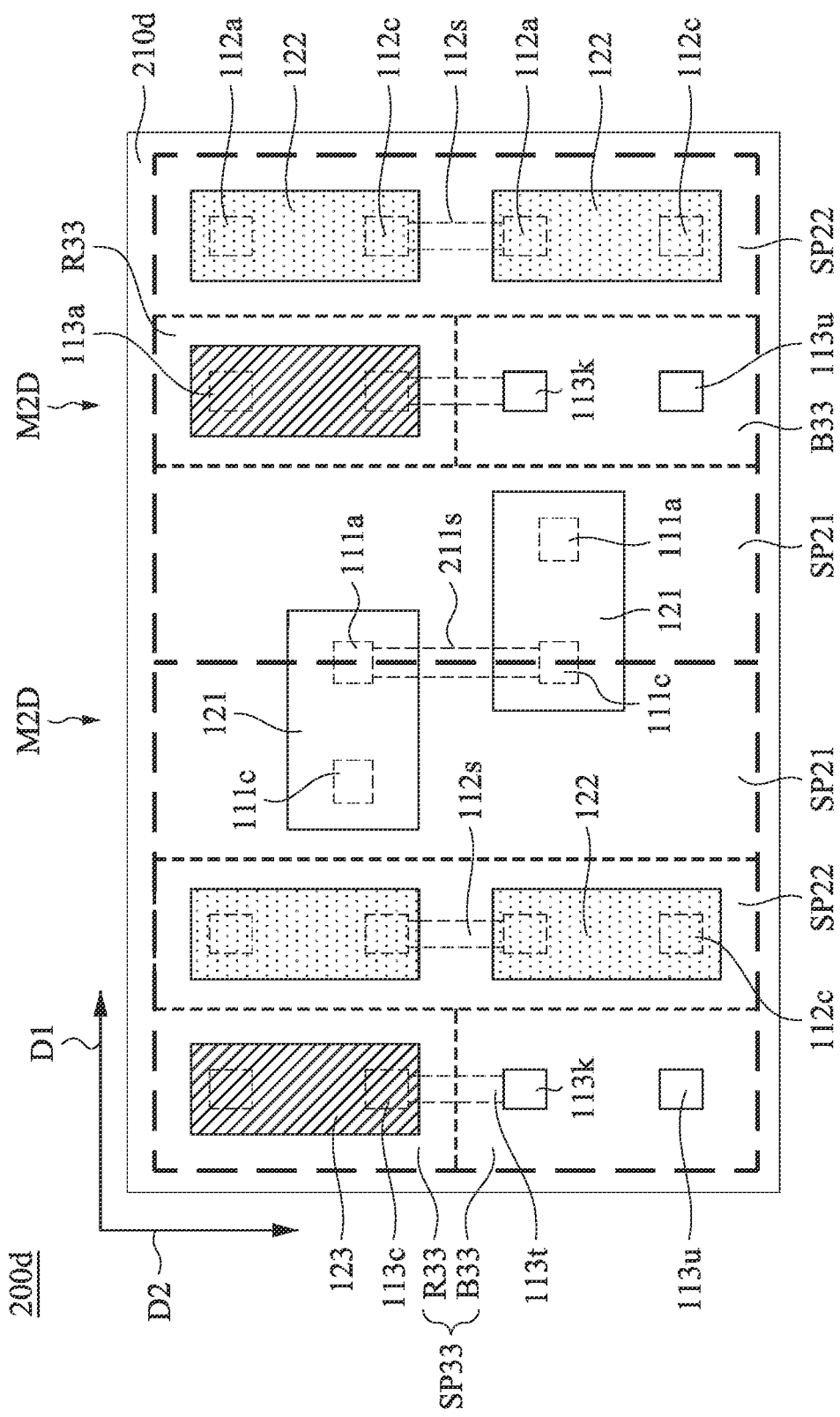
FIG. 2D is a partial schematic plan view of a light emitting panel according to at least one embodiment of this disclosure.

FIG. 2D is a partial schematic plan view of a light emitting panel according to at least one embodiment of this disclosure. Referring to FIG. 2D, the light emitting panel 200d of the present embodiment is similar to the light emitting panel 200a of the previous embodiment. For example, a circuit substrate 210d included in the light emitting panel 200d has a plurality of main pixel areas MD2, where each of the main pixel areas MD2 can be divided into a first subpixel area SP21, a second subpixel area SP22 and a third subpixel area SP33.

However, the only difference between the light emitting panels 200d and 200a is that the circuit substrate 210d includes a plurality of pads 111a, 111c and traces 211s, and a plurality of first light emitting components 121 included in the light emitting panel 200d are electrically connected to the pads 111a, 111c and traces 211s, in which the light emitting panel 200a has no trace 211s. In addition, comparing FIG. 2D and FIG. 2A, it can be understood that the light emitting panel 200d in FIG. 2D is substantially obtained by replacing the traces 111s, the pads 111a, 111c and the first light emitting components 121 in FIG. 2A with the traces 211s, the pads 111a, 111c and the first light emitting components 121 in FIG. 2B.

Figure 3:
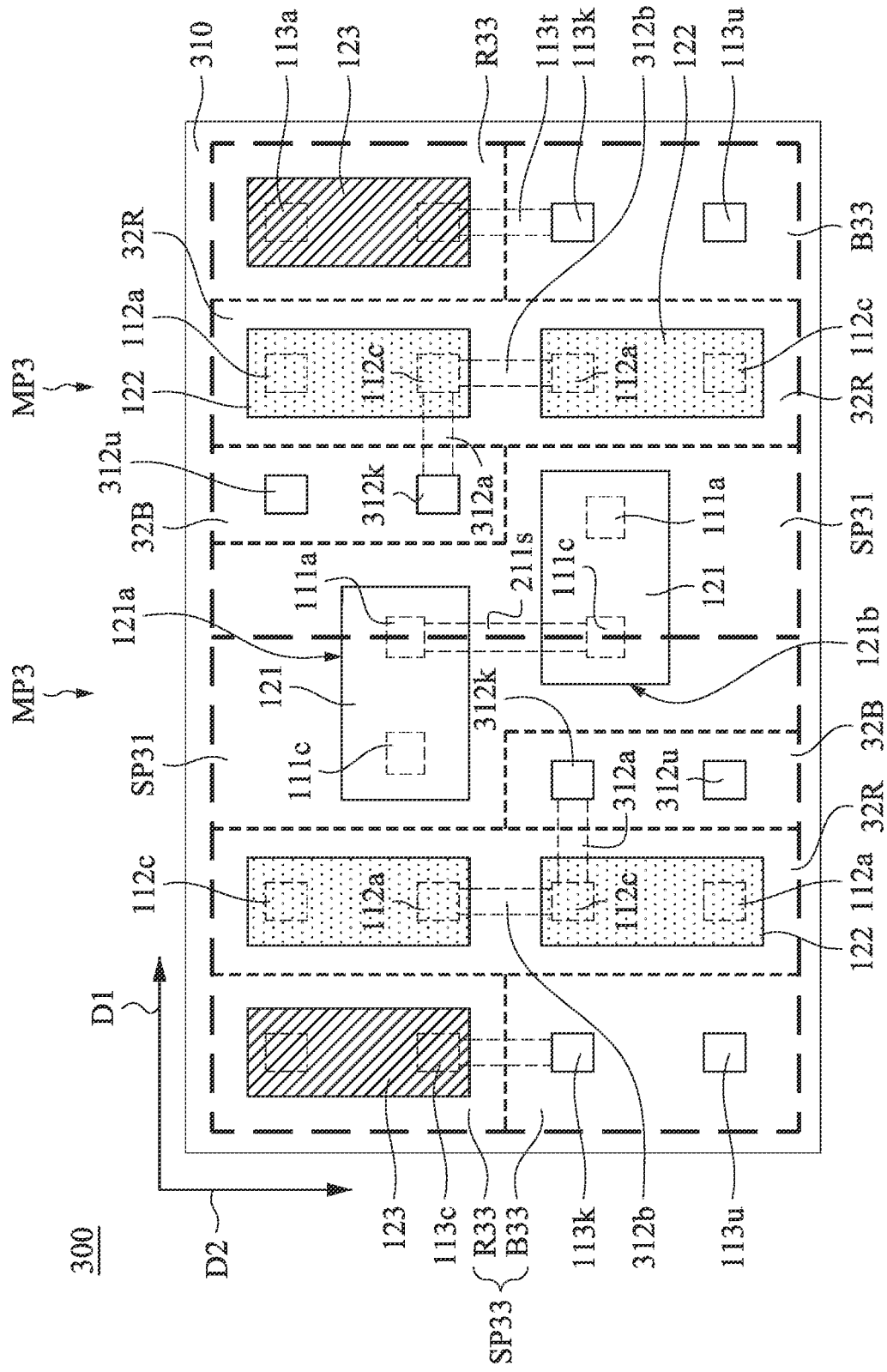
FIG. 3 is a partial schematic plan view of a light emitting panel according to at least one embodiment of this disclosure.

FIG. 3 is a partial schematic plan view of a light emitting panel according to at least one embodiment of this disclosure. Referring to FIG. 3, the light emitting panel 300 of the present embodiment includes a circuit substrate 310, and the circuit substrate 310 has a plurality of main pixel areas MP3, in which each of the main pixel areas MP3 is divided into a first subpixel area SP31, a second subpixel area S32 and a third subpixel area SP33. The light emitting panel 300 is similar to the light emitting panel 200d shown in FIG. 2D. For this reason, the differences between the light emitting panels 300 and 200d are mainly described below while the similarity between the light emitting panels 300 and 200d is basically not repeated.

Specifically, in two adjacent main pixel areas MP3, at least one of the second subpixel areas S32 is further distributed between the long side 121a of one of the first light emitting components 121 and the short side 121b of the other first light emitting component 121 which is adjacent to the previous first light emitting component 121. Hence, in contrast to the light emitting panel 200d shown in FIG. 2D, in the present embodiment, the second subpixel area S32 can have a large area, whereas the first subpixel area SP31 can have a small area.

At least one of the second light emitting components 122 can be disposed in the second subpixel area S32. Taking FIG. 3 for example, multiple second light emitting components 122, such as two second light emitting components 122, can be disposed in each of the second subpixel areas S32. Moreover, at least one second subpixel area S32, e.g., each second subpixel area S32, can be divided into a second-subpixel regular region 32R and a second-subpixel spare region 32B, where the second-subpixel spare region 32B is distributed between the long side 121a of one of the first light emitting components 121 and the short side 121b of the other first light emitting component 121 which is adjacent to the previous first light emitting component 121, as shown in FIG. 3.

The circuit substrate 310 can include a plurality of pads 112a, 112c, a plurality of spare pads 312k, 312u and a plurality of traces 312a and 312b, in which the pads 112a, 112c, the spare pads 312u and the traces 312a, 312b are located in the second subpixel areas S32 respectively and can be used to be electrically connected to the second light emitting components 122.

The pads 112a, 112c and the traces 312b are all located in one of the second-subpixel regular regions 32R. The trace 312b in one of the second-subpixel regular regions 32R is located below the pads 112a and 112c and electrically connected to the pads 112a and 112c, so that two adjacent second light emitting components 122 are electrically connected in series.

In one of the second subpixel areas S32, the spare pads 312u and 312k are located in the second-subpixel spare region 32B, while the trace 312a is located across the second-subpixel regular region 32R and the second-subpixel spare region 32B that are adjacent to each other and is electrically connected to one pad 112c and one spare pads 312k. In one of the second-subpixel spare regions 32B, the anode and the cathode of the second light emitting component 122 can be electrically connected to the spare pads 312u and 312k respectively, where the spare pads 312u can supply positive voltage to the anode of the second light emitting components 122, so that the second light emitting component 122 can emit light (e.g., such as green light).

In the embodiment shown in FIG. 3, when the lower second light emitting component 122 in the left second-subpixel regular region 32R fails, a normal second light emitting component 122 can be disposed in the second-subpixel spare region 32B of one of the second subpixel areas S32 to replace the failing second light emitting component 122. Likewise, when the upper second light emitting component 122 in right second-subpixel regular region 32R fails, a normal second light emitting component 122 can be disposed in the second-subpixel spare region 32B of one of the second subpixel areas S32 to replace the failing second light emitting component 122. In addition, the pads 112a and 112c in each of second-subpixel regular regions 32R in FIG. 3 can be interchanged, so FIG. 3 does not limit the arrangement of the pads 112a and 112c.

It is particular to note that in the embodiment shown in FIG. 3, the arrangement order of the subpixel areas in two adjacent main pixel areas MP3 is different from that of the previous embodiment. In detail, in FIG. 3, the order from left to right of the subpixel areas in two adjacent main pixel areas MP3 is the third subpixel area SP33, the second subpixel area S32, the first subpixel area SP31, the first subpixel area SP31, the second subpixel area S32 and the third subpixel area SP33. Accordingly, in two adjacent main pixel areas MP3, the first subpixel areas SP31 is located between two second subpixel areas S32, and the second subpixel area S32 is located between two third subpixel areas SP33.

The following table (1) discloses the current efficiencies, the panel drive voltages and the relative power consumption of light emitting panels of both an embodiment and a control sample. The light emitting panels of the embodiment and the control sample each include the first light emitting components 121, the second light emitting components 122 and the third light emitting components 123. In the table (1), the first light emitting components 121 are red LEDs, the second light emitting components 122 are green LEDs, and the third light emitting components 123 are blue LEDs.

TABLE 1

|  | Control sample | | | Embodiment | | |
| --- | --- | --- | --- | --- | --- | --- |
|  | Red light | Green light | Blue light | Red light | Green light | Blue light |
| Current efficiency (Unit: cd/A) | 22.3 | 79 | 11 | 38.2 | 158 | 11 |
| Panel drive voltage (Unit: V) |  | 10 |  | 11.5 | 11.5 | 9 |
| Relative power consumption |  | 100% |  |  | 60% |  |

The light emitting panel of the control sample has two adjacent main pixel areas, where a first light emitting component 121 (red LED), a second light emitting components 122 (green LED) and a third light emitting components 123 (blue LED) are disposed in the two adjacent main pixel areas. In addition, in the control sample of the table (1), any two of the first light emitting components 121, the second light emitting components 122 and the third light emitting components 123 are not electrically connected in series.

The light emitting panel of the embodiment has two adjacent main pixel areas, where two first light emitting components 121 (red LED) electrically connected in series, four second light emitting components 122 (green LED) and two third light emitting components 123 (blue LED) which are not electrically connected in series. Two of the four second light emitting components 122 are electrically connected in series, and the other two second light emitting components 122 are electrically connected in series, such as the light emitting panel 200a as shown in FIG. 2A.

In the embodiment of the table (1), the current efficiency of each of the first light emitting components (red LED) 121 is about 19.1 cd/A, so the current efficiency of the two first light emitting components 121 in two adjacent main pixel areas is about 38.2 cd/A, as shown in table (1). Likewise, In the embodiment of the table (1), the current efficiency of each of the second light emitting components (green LED) 122 is about 79 cd/A, so the current efficiency of two second light emitting components 122 in two adjacent main pixel areas are about 158 cd/A.

It can be understood from the above table (1) that the light emitting panel of the embodiment has a high panel drive voltage, but the light emitting panel of the embodiment not only has good current efficiency, but also has lower relative power consumption (about 60%) than control sample. Hence, according to table (1), the luminous efficiency (e.g., current efficiency) of the embodiment is better than the luminous efficiency of the control sample. Therefore, by using multiple light emitting components electrically connected in series, at least one of the embodiment can improve the luminous efficiency of the light emitting panel, thereby enhancing the quality of images of the display.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light emitting panel, comprising:
    a circuit substrate, having a plurality of main pixel areas, wherein each of the main pixel areas is divided into a first subpixel area, a second subpixel area and a third subpixel area, wherein the first subpixel areas in adjacent two main pixel areas are adjacent to each other;
    a plurality of first light emitting diode, disposed on the circuit substrate and located in the first subpixel areas respectively, wherein the first light emitting diode in two first subpixel areas adjacent to each other are electrically connected in a first series circuit to improve luminous efficiency;
    a plurality of second light emitting diode, disposed on the circuit substrate and located in the second subpixel areas respectively; and
    a plurality of third light emitting diode, disposed on the circuit substrate and located in the third subpixel areas respectively, wherein a size of each of the first light emitting diode is larger than a size of each of the second light emitting diode and also larger than a size of each of the third light emitting diode.

2. The light emitting panel of claim 1, wherein at least one of the first light emitting diode is located across adjacent two first subpixel areas.

3. The light emitting panel of claim 1, wherein in one of the main pixel areas, the first subpixel area, the second subpixel area and the third subpixel area are arranged in a first direction, while the first subpixel areas adjacent to each other are arrange in the first direction,
    wherein each first subpixel area, each second subpixel area and each third subpixel area extend in a second direction, and the first direction is not parallel to the second direction.

4. The light emitting panel of claim 3, wherein the first light emitting diode in two of the first subpixel areas adjacent to each other are arranged in the second direction.

5. The light emitting panel of claim 3, wherein at least two of the second light emitting diode are located in one of the second subpixel areas and electrically connected in a second series circuit, and the second light emitting diode in one of the second subpixel areas are arranged in the second direction.

6. The light emitting panel of claim 5, wherein at least two of the third light emitting diode are located in one of the third subpixel areas and electrically connected in a third series circuit, and the third light emitting diode in one of the third subpixel areas are arranged in the second direction.

7. The light emitting panel of claim 3, wherein the first light emitting diode in two of the first subpixel areas adjacent to each other are arranged in the first direction.

8. The light emitting panel of claim 3, wherein the second subpixel area and the third subpixel area both in one of the main pixel areas are arranged in the second direction.

9. The light emitting panel of claim 3, wherein each of the first light emitting diode has a pair of long sides opposite to each other and a pair of short sides opposite to each other, and the long sides are connected to the short sides;
    wherein in two of the first subpixel areas adjacent to each other, any one of the first light emitting diode protrudes one of the short sides of another first light emitting diode.

10. The light emitting panel of claim 9, wherein each of the long sides extends in the first direction, and each of the short sides extends in the second direction;
    wherein in two of the main pixel areas adjacent to each other, at least one of the second subpixel areas is further distributed between the long side of one of the first light emitting diode and the short side of another first light emitting diode which is adjacent to the long side.

11. The light emitting panel of claim 10, wherein at least one of the second subpixel areas is divided into a second-subpixel regular region and a second-subpixel spare region, and at least one of the second light emitting diode is disposed in the second-subpixel regular region,
    wherein the second-subpixel spare region is distributed between the long side of one of the first light emitting diode and the short side of another first light emitting diode which is adjacent to the long side.

12. The light emitting panel of claim 1, wherein each of the first light emitting diode has a pair of long sides opposite to each other and a pair of short sides opposite to each other, and the long sides are connected to the short sides;
    wherein in two of the first subpixel areas adjacent to each other, the short sides of one first light emitting diode are respectively flush with the short sides of another first light emitting diode.

13. The light emitting panel of claim 1, wherein a long side of each of the first light emitting diode extends in a first direction, while both a long side of each of the second light emitting diode and a long side of each of the third light emitting diode extend in a second direction, wherein the first direction is different from the second direction.

14. The light emitting panel of claim 1, wherein at least one of the second subpixel areas is divided into a second-subpixel regular region and a second-subpixel spare region, and one of the second light emitting diode is disposed in the second-subpixel regular region,
    wherein the light emitting panel further comprises a plurality of spare pads, and at least two of the spare pads are disposed in the second-subpixel spare region.

15. The light emitting panel of claim 14, wherein the first subpixel area, the second subpixel area and the third subpixel area in one of the main pixel areas are arranged in a first direction, and the second-subpixel regular region and the second-subpixel spare region are arranged in a second direction, wherein the first direction is different from the second direction.

16. The light emitting panel of claim 14, wherein at least one of the third subpixel areas is divided into a third-subpixel regular region and a third-subpixel spare region, and at least one of the third light emitting diode is disposed in the third-subpixel regular region,
    wherein the spare pads are disposed in the second-subpixel spare region and the third-subpixel spare region.

17. The light emitting panel of claim 16, wherein the first subpixel area, the second subpixel area and the third subpixel area in one of the main pixel areas are arranged in a first direction,
    wherein the second-subpixel regular region and the second-subpixel spare region are arranged in a second direction, and the third-subpixel regular region and the third-subpixel spare region are also arranged in the second direction, wherein the first direction is different from the second direction.

18. The light emitting panel of claim 16, wherein the first light emitting diode in two of the first subpixel areas adjacent to each other are arranged in a first direction, and the third-subpixel regular region and the third-subpixel spare region in one of the main pixel areas are arranged in the first direction.

19. The light emitting panel of claim 1, wherein a current efficiency of each of the first light emitting diode is less than a current efficiency of each of the second light emitting diode and also less than a current efficiency of each of the third light emitting diode.

20. The light emitting panel of claim 1, wherein a light-emitting wavelength of each of the first light emitting diode is less than a light-emitting wavelength of each of the second light emitting diode and also less than a light-emitting wavelength of each of the third light emitting diode.

* * * * *